(12) United States Patent
Wakimoto

(10) Patent No.: US 8,072,827 B2
(45) Date of Patent: Dec. 6, 2011

(54) SEMICONDUCTOR STORAGE DEVICE HAVING REDUNDANCY AREA

(75) Inventor: Kazuomi Wakimoto, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 176 days.

(21) Appl. No.: 12/314,494

(22) Filed: Dec. 11, 2008

(65) Prior Publication Data
US 2009/0161457 A1 Jun. 25, 2009

(30) Foreign Application Priority Data
Dec. 25, 2007 (JP) ................ P2007-331550

(51) Int. Cl.
*G11C 7/00* (2006.01)
(52) U.S. Cl. ....................... 365/200; 365/201
(58) Field of Classification Search .......... 365/200, 365/201
See application file for complete search history.

(56) References Cited

U.S. PATENT DOCUMENTS

| 5,652,725 A * | 7/1997 | Suma et al. ............ 365/200 |
| 6,590,815 B2 | 7/2003 | Mine |
| 2002/0080657 A1* | 6/2002 | Mine ..................... 365/200 |

FOREIGN PATENT DOCUMENTS

JP 2002-124096 4/2002

* cited by examiner

*Primary Examiner* — Jason Lappas
(74) *Attorney, Agent, or Firm* — McGinn IP Law Group, PLLC (57) ABSTRACT

A semiconductor storage device is provided with: a memory cell array which includes a normal area and a redundancy area which replaces a defective memory cell in the normal area; a normal area refresh circuit which performs a CBR refresh operation of a memory cell which is connected to a word line in the normal area; and a redundancy area refresh circuit which performs a CBR refresh operation of a memory cell which is connected to a word line in the redundancy area in parallel with the CBR refresh operation of the memory cell in the normal area.

20 Claims, 5 Drawing Sheets

SEMICONDUCTOR STORAGE DEVICE HAVING REDUNDANCY AREA

BACKGROUND OF THE INVENTION

1. Field of the Invention

The present invention relates to semiconductor storage devices such as a dynamic random access memory (DRAM) which include a redundancy area as an area provided in a memory cell array, and in particular to a semiconductor storage device for which a refresh test of a redundancy area is performed.

Priority is claimed on Japanese Patent Application No. 2007-331550, filed Dec. 25, 2007, the content of which is incorporated herein by reference.

2. Description of Related Art

In semiconductor storage devices such as a DRAM, data retained in memory cells is refreshed at a predetermined cycle. A column-address-strobe (CAS) before row-address-strobe (RAS) refresh (hereinafter referred to as "a CBR refresh") is frequently used as such a refresh.

In a refresh operation in accordance with the CBR refresh, after a CBR refresh command has been input to a semiconductor storage device chip, a refresh address is automatically determined by the semiconductor storage device, a word line corresponding to the refresh address is activated by an X (row) decoder, and a refresh operation is automatically performed in the semiconductor storage device. Moreover, the refresh address is incremented or decremented every time that a CBR refresh command is input, so that different word lines are activated successively and refresh operations of memory cells connected to the respective different word lines are performed successively.

There is also a refresh method in which a refresh operation is performed in response to the input of an Activate command and to the subsequent input of a Precharge command (hereinafter referred to as "Activate command→Precharge command"). In this refresh operation, an Activate command for a memory cell array is input to a semiconductor storage device, and a refresh address is input to the semiconductor storage device at the same time. Subsequently, after a predetermined time tRAS (i.e., a waiting time from when the Activate command has been input until when a Precharge command is input) has elapsed, the Precharge command is input to the semiconductor storage device to precharge bit lines, and then a refresh operation is performed. In accordance with this refresh method, it is necessary to input a refresh address every time an Activate command is input. Moreover, the time required for the refresh operation is determined by the interval between commands input from the outside of the semiconductor storage device (i.e., an input interval between the Activate command and the Precharge command).

The present inventor recognized the following matters.

There are several problems in methods for performing a refresh test of a redundancy area in a semiconductor storage device.

As a first problem, although semiconductor storage devices may be configured to allow inputting CBR refresh commands for a normal area, such semiconductor storage devices are not configured to allow inputting CBR refresh commands for a redundancy area. For this reason, it is impossible to perform CBR refresh operations for the redundancy area, and hence refresh operations in accordance with the sequence of "Activate command→Precharge command" are used instead of the CBR refresh operations.

As a second problem, defective bits detected by a refresh test in accordance with a refresh method for a normal area may be different from those detected by a refresh test in accordance with a refresh method for a redundancy area due to a difference between these refresh methods. This problem is caused by a difference in internal operation timing between refresh operations in accordance with a CBR refresh command and those in accordance with the sequence of "Activate command→Precharge command". Specifically, in accordance with the CBR refresh command, the refresh operations are realized by automatically performing an activation operation followed by a precharge operation (hereinafter referred to as "Activate→Precharge") in the chip. In contrast, in accordance with the sequence of "Activate command→Precharge command", the refresh operations are performed in response to the commands supplied from a tester.

Therefore, it is desirable to avoid a situation in which defective memory cells cannot be detected by a refresh test of a redundancy area, which is caused by a difference in timing between refresh operations in accordance with the CBR refresh command and refresh operations in accordance with the sequence of "Activate command→Precharge command", by making it possible to input CBR refresh commands for the redundancy area. In other words, it is desirable to detect unstable bits (memory cells) having poor hold characteristics by performing CBR refresh operations for the redundancy area under the same conditions as those when semiconductor storage devices are actually used after the shipment thereof, thereby allowing the replacement of the unstable memory cells with redundancy memory cells. It is also desirable to solve the problem in that when CBR refresh operations for memory cells in the redundancy area are performed, the time required for the refresh operations increases in proportion to the number of the word lines in the redundancy area (hereinafter may be referred to as "redundancy word lines").

Meanwhile, there is a semiconductor storage device which performs CBR refresh operations for a redundancy area (see Japanese Unexamined Patent Application, First Publication No. 2002-124096 (hereinafter referred to as "Patent Document 1")). The Patent Document 1 aims at providing a semiconductor storage device which is capable of performing CBR refresh tests in the same manner as those for normal memory cells by inputting CBR commands of the same number of times as the number of the redundancy word lines and thereby ensuring the reliability of the redundancy word lines. To this end, the Patent Document 1 is provided with a redundancy CBR refresh counter. When performing a refresh test for redundancy memory cells, the redundancy CBR refresh counter is activated every time a control signal is input, the number of CBR commands which have been input is counted by the redundancy CBR refresh counter, and the counted value is output to an X address buffer as a redundancy counter signal. The X address buffer switches between an address counter signal output from a CBR refresh counter and the redundancy counter signal output from the redundancy CBR refresh counter so as to correspond to a case of performing a refresh test of memory cells and a case of performing a refresh test of redundancy memory cells, and outputs the switched counter signal as a counter signal used for generating an internal X address (XA0-XA11).

In this way, the semiconductor storage device of the Patent Document 1 switches between the address counter signal output from the CBR refresh counter and the redundancy counter signal output from the redundancy CBR refresh counter so as to correspond to the refresh test of the memory cells and the refresh test of the redundancy memory cells, and outputs the switched counter signal. As a result, it is impossible to test both the memory cells and the redundancy memory cells simultaneously, and hence it is necessary to test the memory cells and the redundancy memory cells separately, resulting in an increase in time required for the refresh test. There is also a problem in that control becomes complex because it is necessary to switch between the address counter signal output from the CBR refresh counter and the redundancy counter signal output from the redundancy CBR refresh counter, and to output the switched counter signal.

SUMMARY

The present invention seeks to solve one or more of the above problems, or to improve upon those problems at least in part.

In one embodiment, there is provided a semiconductor storage device that is provided with: a memory cell array which includes a normal area and a redundancy area which replaces a defective memory cell in the normal area; a normal area refresh circuit which performs a CBR refresh operation of a memory cell which is connected to a word line in the normal area; and a redundancy area refresh circuit which performs a CBR refresh operation of a memory cell which is connected to a word line in the redundancy area in parallel with the CBR refresh operation of the memory cell in the normal area.

In another embodiment, there is provided a semiconductor storage device that is provided with: a storage means including a normal area and a redundancy area for replacing a defective memory cell in the normal area; a normal area refresh means for performing a CBR refresh operation of a memory cell connected to a word line in the normal area; and a redundancy area refresh means for performing a CBR refresh operation of a memory cell connected to a word line in the redundancy area in parallel with the CBR refresh operation of the memory cell in the normal area.

In a still another embodiment, there is provided a semiconductor storage device that is provided with: a memory cell array which includes a normal area and a redundancy area which replaces a defective memory cell in the normal area; a normal area refresh circuit which performs a CBR refresh operation of a memory cell which is connected to a word line in the normal area; and a redundancy area refresh circuit which performs a CBR refresh operation of a memory cell which is connected to a word line in the redundancy area, at least a part of the CBR refresh operation of the memory cell in the redundancy area overlapping the CBR refresh operation of the memory cell in the normal area.

In the foregoing embodiments, a CBR refresh operation for the redundancy area is performed in the same manner as that for the normal area. Moreover, if CBR refresh operations for the redundancy area are performed after the completion of CBR refresh operations for the normal area, the time required for the whole refresh operations increases depending on the number of the word lines in the redundancy area. Therefore, a CBR refresh operation for the redundancy area is performed in parallel with (or simultaneously with) a CBR refresh operation for the normal area.

In this way, CBR refresh operations are performed in a refresh test of memory cells provided in the redundancy area. In addition, CBR refresh operations which are identical to those for the normal area are performed for the redundancy area. Therefore, it is possible to address the problems cause by employment of refresh operations in accordance with the sequence of "Activate command→Precharge command" for a redundancy area (e.g., the problem in that defective bits which have been detected by a refresh test in accordance with a refresh method for a normal area may be different from those which have been detected by a refresh test in accordance with a refresh method for a redundancy area). As a result, it is possible to avoid the situation in which defective memory cells cannot be detected by the refresh test of the redundancy area. Moreover, since a CBR refresh operation for the normal area is performed in parallel with a CBR refresh operation for the redundancy area, it is possible to reduce the time required for CBR refresh operations for the redundancy area in the refresh test without the need for complex control.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the present invention is not limited to the embodiments illustrated for explanatory purposes.

Explanation of Structure

Figure 1:
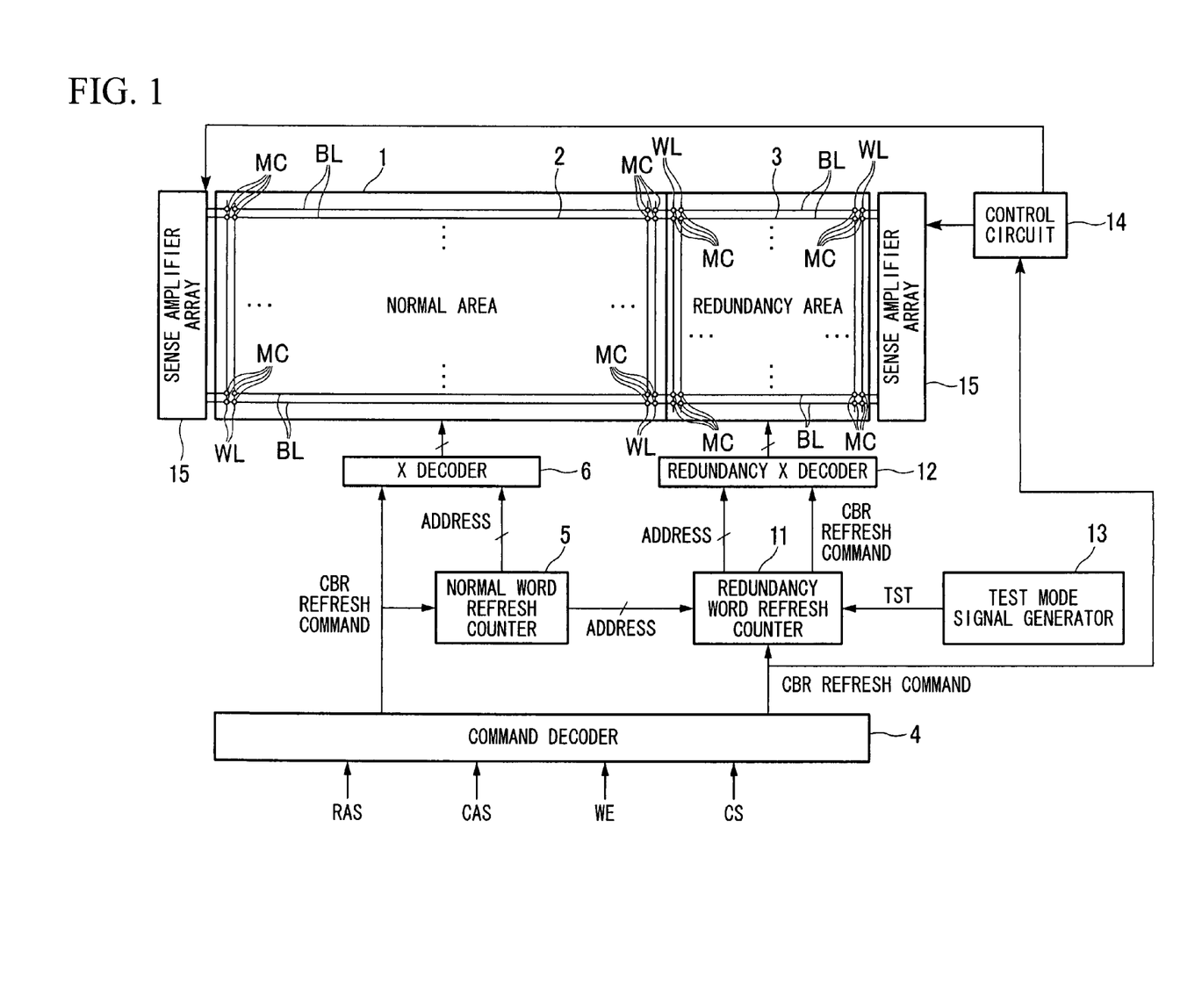
FIG. 1 is a block diagram showing the structure of a principal portion of a semiconductor storage device in accordance with a first embodiment of the present invention.

FIG. 1 is a diagram showing the structure of a principal portion of a semiconductor storage device in accordance with a first embodiment of the present invention. Specifically, FIG. 1 is a block diagram showing the whole structure of an exemplary circuit which performs a refresh test of a normal area and a redundancy area in the semiconductor storage device of the present embodiment. It should be noted that although the semiconductor storage device of the present embodiment is provided with various circuits such as a Y (column) decoder and a data input/output circuit similar to common semiconductor storage devices such as a DRAM, these circuits, which are not directly related to refresh operations are not shown in FIG. 1.

In FIG. 1, reference numeral 1 denotes a memory cell array (a storage means) in which memory cells MC are arranged in a matrix at intersections between word lines WL (hereinafter referred to as "word lines") and bit lines BL (hereinafter referred to as "bit lines"). The memory cell array 1 is composed of a normal area 2 and a redundancy area 3, which is used for replacing defective memory cells in the normal area 2.

Reference numeral 4 denotes a command decoder. Reference numeral 5 denotes a normal word refresh counter (a normal word line address generating circuit) which generates the address of a word line in the normal area 2 when performing a CBR refresh of memory cells connected to the word line in the normal area 2. Reference numeral 6 denotes an X decoder used for selecting a word line in the normal area 2.

When performing a CBR refresh operation of memory cells connected to a word line in the redundancy area 3, a redundancy word refresh counter 11 (a redundancy word line address generating circuit) generates the address of the word line in the redundancy area 3 which is the subject of the CBR refresh operation based on the address generated by the normal word refresh counter 5 in synchronization with a CBR refresh command. Reference numeral 12 denotes a redundancy X decoder used for selecting a redundancy word line.

Reference numeral 13 denotes a test mode signal generator. Since the redundancy word refresh counter 11 does not need to operate during a normal operation, the test mode signal generator 13 generates a test mode signal TST only when a CBR refresh test of the redundancy area 3 is performed, and the redundancy word refresh counter 11 enables the operation of the redundancy word refresh counter 11 itself in response to the test mode signal TST. As such, it is possible to perform the CBR refresh test of the redundancy area 3 by generating the addresses of the word lines in the redundancy area 3 only in the test mode (in other words, by performing control so as not perform refresh operations of the redundancy area 3 during the normal operation).

The command decoder 4 is controlled by input signals RAS, CAS, WE, and CS, which are supplied from the outside of the semiconductor storage device. Commands issued to the semiconductor storage device are specified by combinations of the levels and/or input timings of the input signals. The normal word refresh counter 5 counts the number of CBR refresh commands for the normal area 2, and generates the address of a word line in the normal area 2 which is the subject of a CBR refresh operation. The normal word refresh counter 5 and the X decoder 6 are connected to the command decoder 4 through bus lines and are controlled by the command decoder 4. It should be noted that the input signal RAS denotes a row address strobe signal, the input signal CAS denotes a column address strobe signal, the input signal WE denotes a write enable signal, and the input signal CS denotes a chip select signal.

The redundancy word refresh counter 11 is controlled by the command decoder 4 and the normal word refresh counter 5. The redundancy X decoder 12 is connected to the redundancy word refresh counter 11 through a bus line and is controlled by the redundancy word refresh counter 11.

Control of the redundancy word refresh counter 11 is performed by the normal word refresh counter 5 and the command decoder 4 as follows.

The redundancy word refresh counter 11 detects that a CBR refresh command is input thereto and that the value of predetermined lower bits (e.g., bits A0-A6) of an address generated by the normal word refresh counter 5 is a predetermined value (e.g., all of these bits are "0" or all of these bits are "1").

If the redundancy word refresh counter 11 has detected that the lower bits of the address are all "0" or all "1", the redundancy word refresh counter 11 generates the address of a word line in the redundancy area 3 in synchronization with the CBR refresh command based on upper bits of the address generated by the normal word refresh counter 5, and outputs the generated address together with the CBR refresh command to the redundancy X decoder 12. Subsequently, the word line in the redundancy area 3 is selected by the redundancy X decoder 12, and the CBR refresh operation of the redundancy area 3 is performed. It should be noted that the redundancy word refresh counter 11 may be configured such that the redundancy word refresh counter 11 increments or decrements its count value every time that it has detected that a CBR refresh command is input thereto and that the lower bits of the address are all "0" or all "1", and outputs the incremented or decremented count value as the address of a word line in the redundancy area 3 which is the subject of a CBR refresh operation.

At this time, the CBR refresh operation of the normal area 2 based on the address output from the normal word refresh counter 5 is performed in parallel with (or simultaneously with) the CBR refresh operation of the redundancy area 3 based on the address output from the redundancy word refresh counter 11. In other words, at least a part of the CBR refresh operation of the redundancy area 3 (i.e., the CBR refresh operation of the redundancy area 3 partly or entirely) overlaps the CBR refresh operation of the normal area 2. It should be noted that a CBR refresh operation of the normal area 2 and a CBR refresh operation of the redundancy area 3 are performed by sense amplifier (SA) arrays 15 under control of a control circuit 14, which has received a CBR refresh command from the command decoder 4. Since the specific operations of the control circuit 14 and the SA arrays 15 are similar to those of semiconductor storage devices which perform CBR refresh operations in response to CBR refresh commands, the explanation thereof is omitted herein. Moreover, the normal word refresh counter 5, the X decoder 6, the control circuit 14, and the SA arrays 15 function as a normal area refresh circuit and normal area refresh means, and the redundancy word refresh counter 11, the redundancy X decoder 12, the control circuit 14, and the SA arrays 15 function as a redundancy area refresh circuit and redundancy area refresh means.

Explanation of Operation

Next, the refresh operations of the normal area 2 and the redundancy area 3 will be explained in detail.

Figure 2:
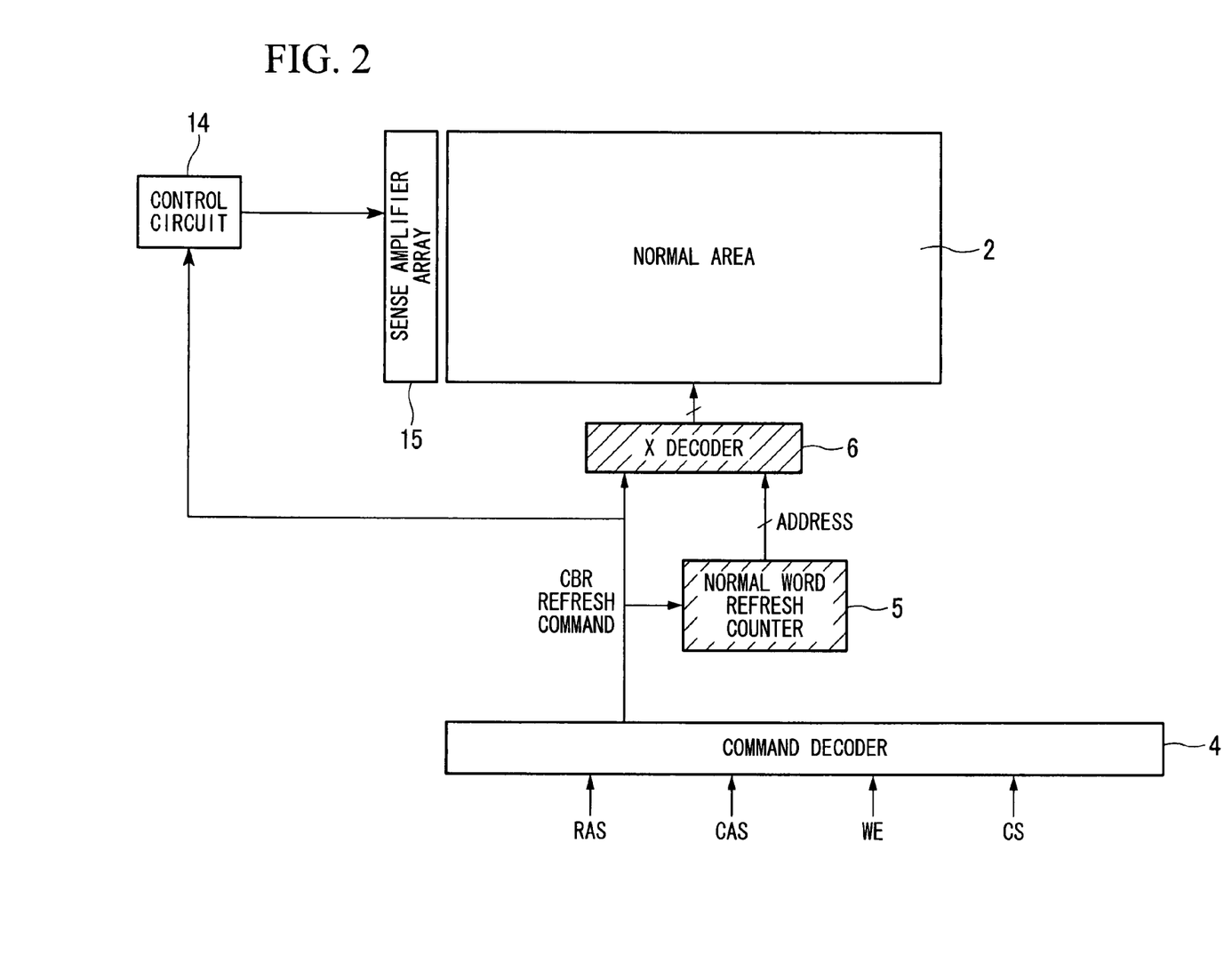
FIG. 2 is a diagram showing a CBR refresh operation of memory cells in a normal area of a memory cell array.

As shown in FIG. 2, CBR refresh operations of the normal area 2 are performed by the command decoder 4, the normal word refresh counter 5, which generates the address of a word line in the normal area 2 which is the subject of a refresh operation, the X decoder 6, which selects the word line corresponding to the address generated by the normal word refresh counter 5, the control circuit 14, and an SA array 15. The input signals RAS, CAS, WE, and CS are input to the command decoder 4 from the outside of the semiconductor storage device.

In normal CBR refresh operations, the normal word refresh counter 5 generates the address of a different word line in the normal area 2 every time the normal word refresh counter 5 receives a CBR refresh command, and the X decoder 6 selects the word line specified by the address. Subsequently, the refresh operation of memory cells connected to the selected word line is performed.

Figure 3:
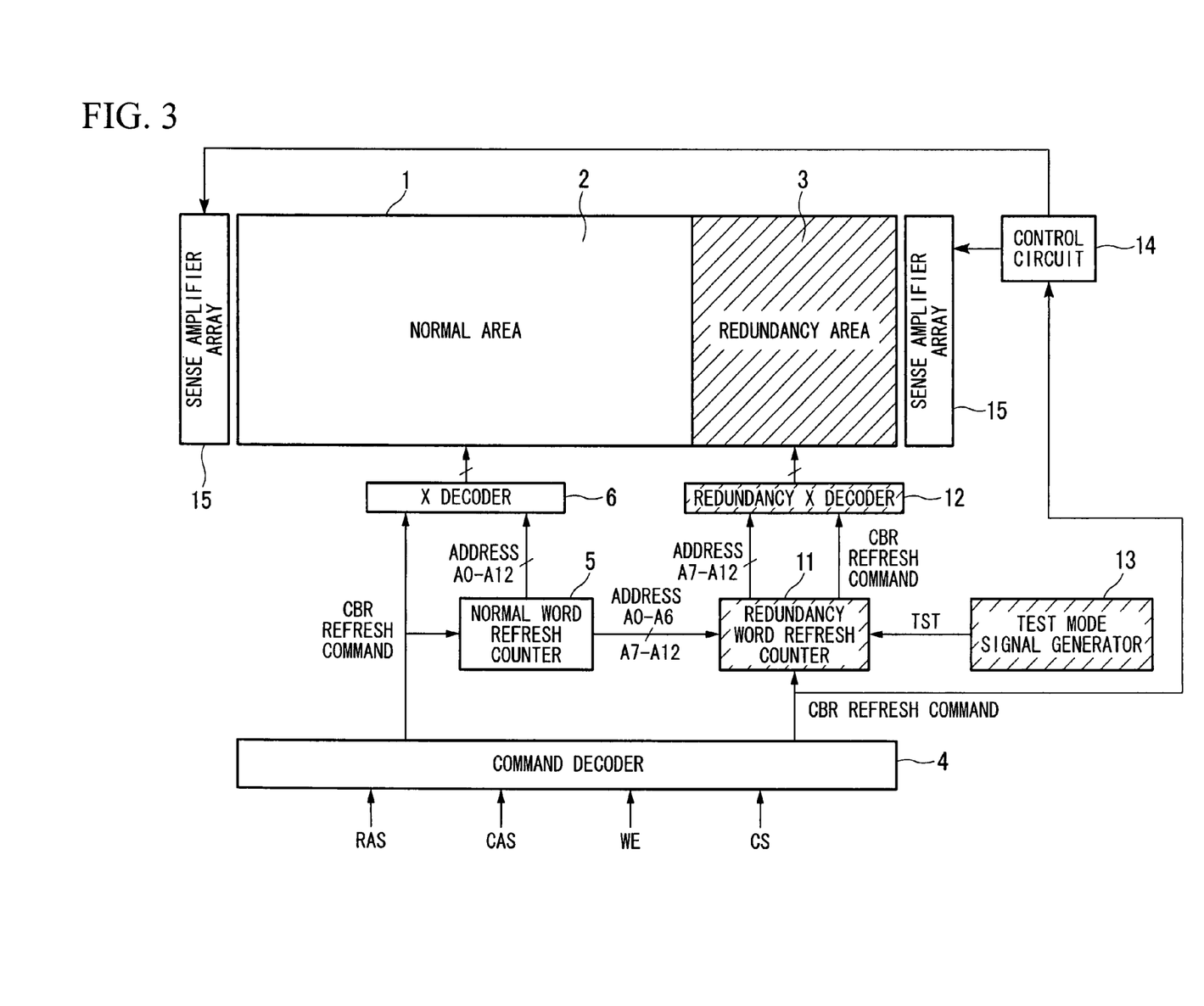
FIG. 3 is a diagram showing a CBR refresh operation of memory cells in a redundancy area of the memory cell array.

On the other hand, as shown in FIG. 3, in CBR refresh operations of the redundancy area 3, an address (e.g., bits A0-A12) is sent from the normal word refresh counter 5 to the redundancy word refresh counter 11. If a CBR refresh command is input and the value lower bits (e.g., bits A0-A6) of the address is a predetermined value, the redundancy word refresh counter 11 sends upper bits (e.g., bits A7-A12) of the address together with the CBR refresh command to the redundancy X decoder 12. The redundancy X decoder 12 selects the word line in the redundancy area 3 which corresponds to the upper bits A7-A12 of the address thus sent. It should be noted that the redundancy word refresh counter 11 is not used in a normal operation and it is enabled in response to the test mode signal TST, which is output from the test mode signal generator 13 when a refresh test is performed.

For example, when the number of the word lines in the normal area 2 is 8192 and the number of the word lines in the redundancy area 3 is 64, a CBR refresh operation of a normal word line is performed in parallel with a CBR refresh operation of a redundancy word line once per refresh operations of 128 word lines in the normal area 2.

In this case, the redundancy word refresh counter 11 operates by detecting that the lower bits A0-A6 of the address generated by the normal word refresh counter 5 shown in FIG. 3 are all "0" or all "1".

In order to select one of the 64 redundancy word lines, the redundancy word refresh counter 11 receives the upper bits A7-A12 of the address from the normal word refresh counter 5, and sends the upper bits A7-A12 to the redundancy X decoder 12 at the aforementioned timing. The redundancy X decoder 12 selects one of the word lines in the redundancy area 3 based on the upper bits A7-A12 of the address. Subsequently, the CBR refresh operation of memory cells connected to the redundancy word line in the redundancy area 3 is performed in parallel with the CBR refresh operation of memory cells connected to the word line in the normal area 2.

When 8192 CBR refresh operations of the normal area 2 have been performed, the CBR refresh operations of all the 64 redundancy word lines are completed.

As another example, when the number of the word lines in the normal area 2 is 4096 and the number of the redundancy word lines in the redundancy area 3 is 64, a CBR refresh operation of memory cells connected to a word line in the normal area 2 is performed in parallel with a CBR refresh operation of memory cells connected to a redundancy word line in the redundancy area 3 once per 64 CBR refresh operations of the memory cells connected to the word lines in the normal area 2.

In this case, the redundancy word refresh counter 11 operates by detecting that the value of the lower bits A0-A5 of the address input from the normal word refresh counter 5 is a predetermined value (e.g., all "0" or all "1"). In order to select one of the 64 redundancy word lines in the redundancy area 3, the redundancy word refresh counter 11 receives the upper bits A6-A11 of the address from the normal word refresh counter 5 and sends the upper bits A6-A11 to the redundancy X decoder 12. The redundancy X decoder 12 selects one of the redundancy word lines in accordance with the upper bits A6-A11 of the address. Subsequently, a CBR refresh operation of the word line in the normal area 2 is performed in parallel with a CBR refresh operation of the word line in the redundancy area 3.

In this way, a CBR refresh operation of the normal area 2 is performed in parallel with a CBR refresh operation of the redundancy area 3 every time that CBR refresh operations of the normal area 2 are performed a predetermined number of times (128 or 64 times in the foregoing examples), by generating the address of a word line in the redundancy area 3 every time that the CBR refresh operations of the normal area 2 are performed the predetermined number of times (i.e., every time that the addresses of word lines in the normal area 2 are generated the predetermined number of times).

Generalizing the foregoing discussion, when the number of the word lines in the normal area 2 is m (m is an integer greater than or equal to 1) and the number of the word lines in the redundancy area 3 is p (p is an integer greater than or equal to 1), the predetermined number of times is m/p. Although the predetermined number of times is preferably m/p, it is not limited to this value, and it may be, for example, an integer greater than or equal to 1 and less than or equal to m/p. Moreover, it is preferable that the CBR refresh operations of the p word lines in the redundancy area 3 be performed on or before the completion of the CBR refresh operations of the m word lines in the normal area 2.

Figure 4:
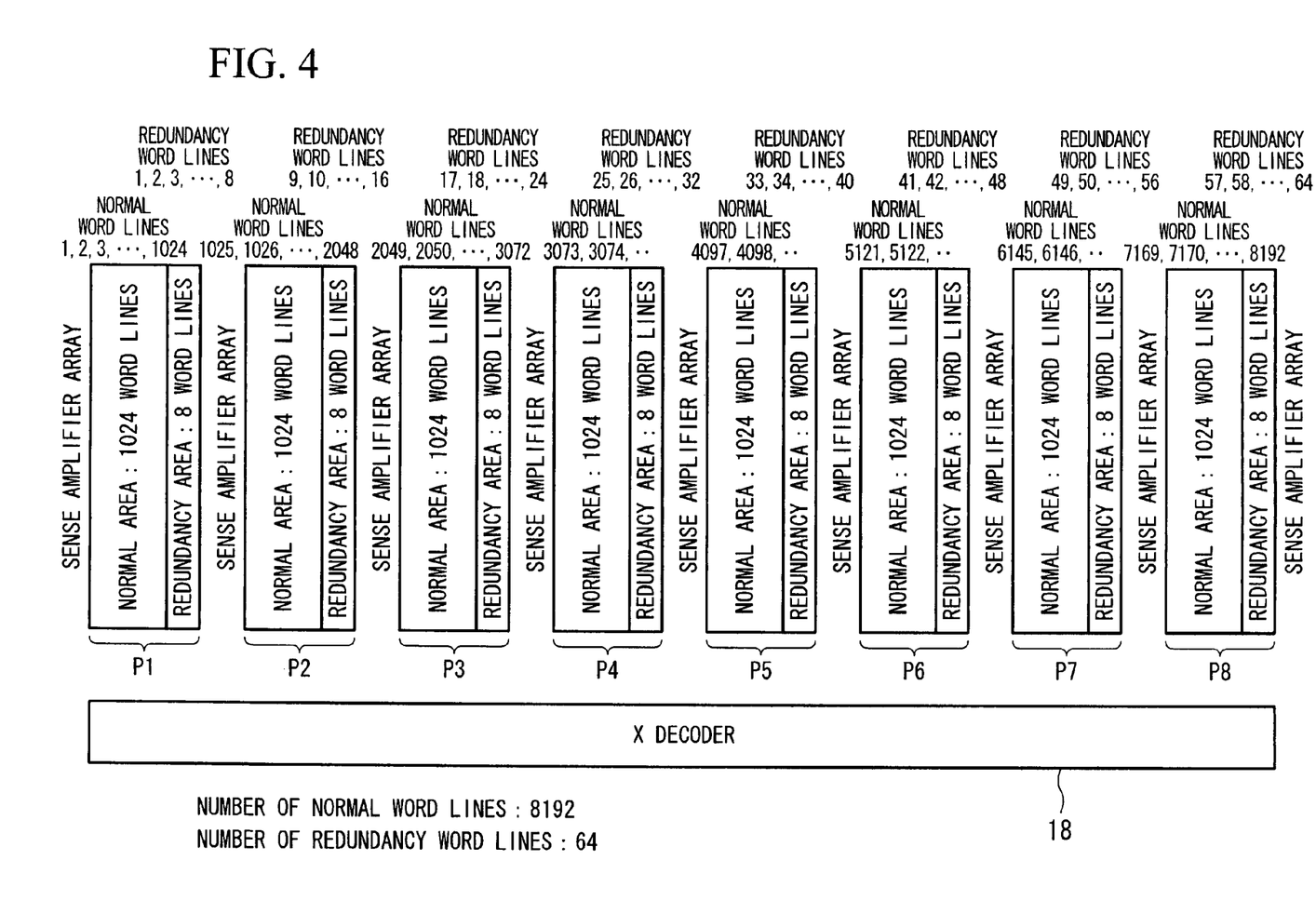
FIG. 4 is a diagram showing a first example of the assignment of addresses to the word lines in normal areas and the word lines in redundancy areas.

FIG. 4 is a diagram showing a first example of the assignment of addresses to the word lines in normal areas and the word lines in redundancy areas of the semiconductor storage device in accordance with the present embodiment. More specifically, FIG. 4 shows an example in which addresses are assigned to the word lines provided in a memory cell array which includes a normal area having 8192 word lines and a redundancy area having 64 word lines and which is divided into eight plates P1-P8. In FIG. 4, each of the plates P1-P8 is composed of a normal area including 1024 word lines and a redundancy area including 8 word lines, and SA arrays are provided for the plates P1-P8. It should be noted that an X decoder 18 is an aggregation of X decoders 6 and redundancy X decoders 12 provided in the plates.

With respect to the plate P1, in the normal area, addresses 0, 1, . . . , and 1023 are respectively assigned to a first word line, a second word line, . . . , and a 1024th word line, and in the redundancy area, addresses 0, 1, . . . , and 7 are respectively assigned to a first word line, a second word line, . . . , and an eighth word line.

With respect to the plate P2, in the normal area, addresses 1024, 1025, . . . , and 2047 are respectively assigned to a 1025th word line, a 1026th word line, . . . , and a 2048th word line, and in the redundancy area, addresses 8, 9, . . . , and 15 are assigned to a ninth word line, a tenth word line, . . . , and a sixteenth word line.

In the respective plates P3-P8, addresses are sequentially assigned to 1024 word lines in each normal area and to 8 word lines in each redundancy area, in the same manner as the plates P1 and P2.

In accordance with the address assignment of the word lines in the normal areas and the word lines in the redundancy areas shown in FIG. 4, CBR refresh operations are performed in parallel for a word line in each normal area and a word line in each redundancy area once per 128 CBR refresh operations of 128 word lines in each normal area. In other words, CBR refresh operations are performed in parallel for a word line in each normal area and a word line in each redundancy area once per 128 times so as to correspond to a ratio of 1024 word lines in each normal area: 8 word lines in each redundancy area.

In this case, for example, in the plate P1, the 128th word line in the normal area and the first word line in the redundancy area are selected at the same time. As a result, two word lines which are respectively connected to memory cells that are connected to the same bit line are activated simultaneously. Therefore, there is a possibility that data stored in the memory cells is corrupted.

Figure 5:
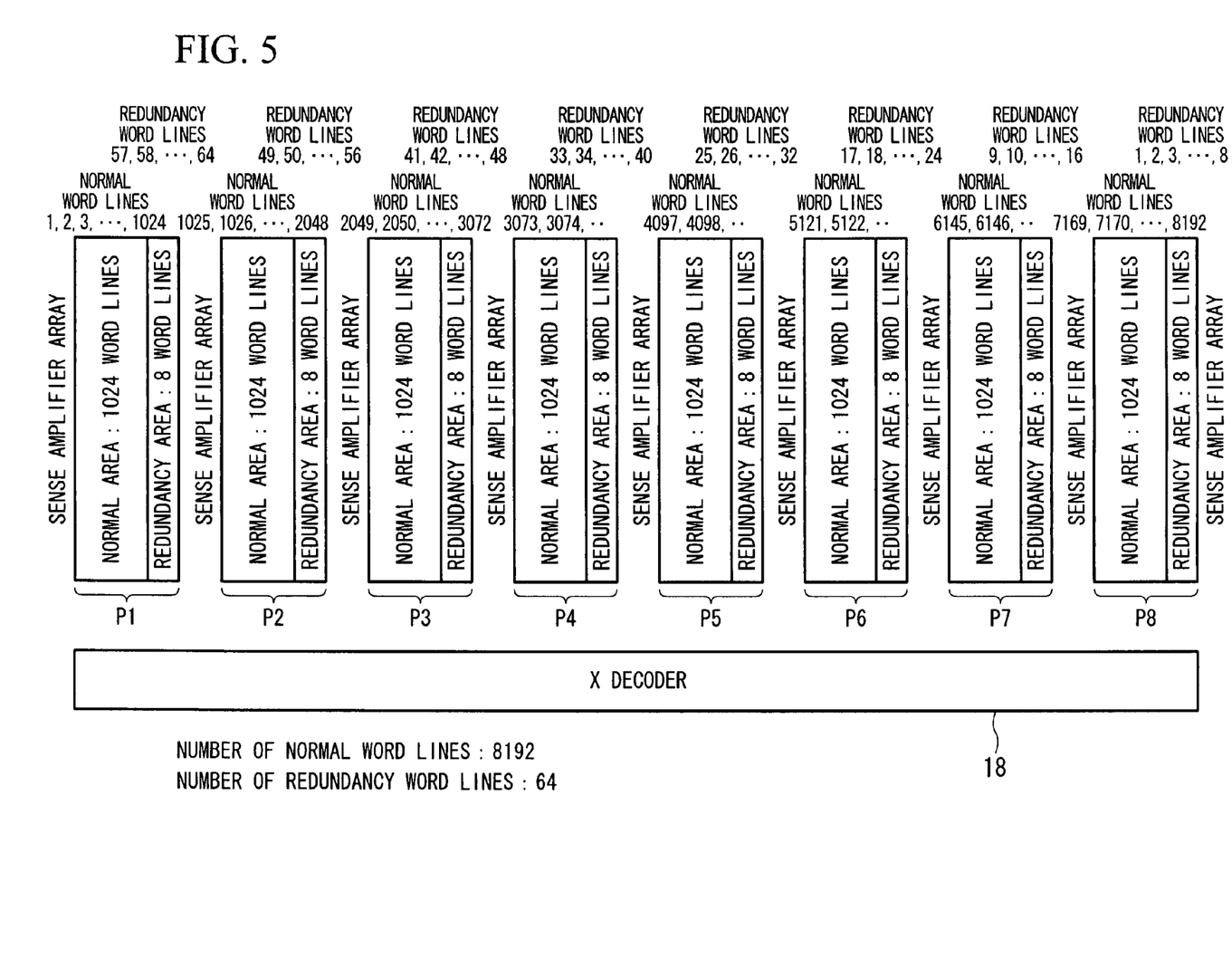
FIG. 5 is a diagram showing a second example of the assignment of addresses to the word lines in the normal areas and the word lines in the redundancy areas.

Thus, as one of measures for avoiding the data corruption, the address assignment of the word lines in the redundancy areas is changed from that shown in FIG. 4 to that shown in FIG. 5. FIG. 5 shows a second example of the assignment of addresses to the word lines in the normal areas and the word lines in the redundancy areas. More specifically, the address assignment of the word lines in the redundancy areas is changed such that the 57th to 64th word lines in the redundancy area of the plate P8 shown in FIG. 4 are arranged at positions corresponding to the positions of the first to eighth word lines in the redundancy area of the plate P1 shown in FIG. 4. Similarly, the address assignment of the word lines in the other redundancy areas is changed such that the word lines in the redundancy areas of the plates P7-P1 shown in FIG. 4 are respectively arranged at positions corresponding to the positions of the word lines in the redundancy areas of the plates P2-P8 shown in FIG. 4.

The address of the corresponding word line in the redundancy area is determined using the upper bits A7-A12 of an address output from the normal word refresh counter 5, and thus the plate including the normal area which is the subject of a refresh operation and the plate including the redundancy normal area which is the subject of a refresh operation can be determined. For example, when the value of the upper bits A7-A12 of the address output from the normal word refresh counter 5 is 8, the address of the corresponding word line in the redundancy area is set to 48. To this end, the redundancy word refresh counter 11 determines the address of the word line in the redundancy area which corresponds to the upper bits A7-A12 of the address output from the normal word refresh counter 5 based on the relations between the addresses of the word lines in the normal area and the addresses of the word lines in the redundancy area, and outputs the determined address to the redundancy X decoder 12.

In this way, by employing the address assignment shown in FIG. 5, when a CBR refresh operation of a normal area 2 is performed in parallel with a CBR refresh operation of a redundancy area 3, it is possible to ensure that the plate including the normal area 2 which is the subject of the refresh operation is different from the plate including the redundancy area 3 which is the subject of the refresh operation. As a result, it is possible to avoid a situation in which memory cells in the same plate which are connected to the same bit line are refreshed simultaneously, thereby preventing data stored in the memory cells from being corrupted.

Generalizing the foregoing discussion, when there are N plates (N is an integer greater than or equal to 1) each having a normal area 2 and a redundancy area 3, the number of the word lines in the normal area 2 is m, and the number of the word lines in the redundancy area 3 is p, an example of the address assignment is as follows.

Specifically, the addresses of the word lines in the normal areas of a first plate to an Nth plate are set as described below.

In the normal area of the first plate P1, the addresses of the first word line, the second word line, . . . , and the mth word line are respectively set to 0, 1, . . . , and m−1.

In the normal area of the second plate P2, the addresses of the (m+1)th word line, (m+2)th word line, . . . and the (2m)th word line are respectively set to m, m+1, . . . , 2m−1.

In the normal area of the Nth plate PN, the addresses of the (m(N−1)+1)th word line, the (m(N−1)+2)th word line, . . . , and the (Nm)th word line are respectively set to m(N−1), m(N−1)+1, . . . and, Nm−1.

In other words, with respect to the ith (i is an integer in the range between 1 and N) plate, the addresses of the word lines in the normal area are respectively set to (i−1)m to im−1.

In contrast, the addresses of the word lines in the redundancy areas of the first plate to the Nth plate are set as described below.

In the redundancy area of the first plate P1, the addresses of the (p(N−1)+1)th word line, the (p(N−1)+2)th, . . . , and the (Np)th word line are respectively set to p (N−1), p(N−1)+1, . . . , and Np−1.

In the redundancy area of the (N−1)th plate P(N−1), the addresses of the (p+1)th word line, the (p+2)th word line, . . . , and the (2p)th word line are respectively set to p, p+1, . . . , 2p−1.

In the redundancy area of the Nth plate PN, the addresses of the first word line, the second word line, . . . , the pth word line are respectively set to 0, 1, . . . , and p−1.

In other words, with respect to the ith plate, the addresses of the word lines in the redundancy area are respectively set to (N−i)p to (N−i+1)p−1.

In the example shown in FIG. 5, with respect to the normal areas in the first plate P1 to the eighth plate P8, the addresses of the first to 1024th word lines, 1025th to 2048th word lines, . . . , and 7169th to 8192nd word lines are respectively set to 0 to 1023, 1024 to 2047, . . . , and 7168 to 8191.

Moreover, with respect to the redundancy areas in the first plate P1 to the eighth plate P8, the addresses of the 57th to 64th word lines, . . . , the 9th to 16th word lines, and the first to eighth word lines are respectively set to 56 to 63, . . . , 8 to 15, and 0 to 7.

It should be noted that the address assignment of the word lines in the normal areas and the redundancy areas is not limited to that of the example shown in FIG. 5. It is sufficient that the plate of a normal area which is the subject of a refresh operation is different from the plate of a redundancy area which is the subject of a refresh operation when the refresh operation of the normal area is performed in parallel with the refresh operation of the redundancy area. Therefore, various combinations are possible with respect to the address assignment of the word lines in the normal areas and the word lines in the redundancy areas.

It is apparent that the present invention is not limited to the above embodiments, but may be modified and changed without departing from the scope and spirit of the invention.

What is claimed is:

1. A semiconductor storage device comprising:
a memory cell array which includes a normal area and a redundancy area which replaces a defective memory cell in the normal area;
a normal area refresh circuit which generates an address of a word line in the normal area and performs a CBR refresh operation of a memory cell which is connected to the word line in the normal area; and
a redundancy area refresh circuit which receives the address from the normal area refresh circuit and based on the address performs a CBR refresh operation of a memory cell which is connected to a word line in the redundancy area in parallel with the CBR refresh operation of the memory cell in the normal area.

2. The semiconductor storage device according to claim 1, wherein the normal area refresh circuit comprises a normal word line address generating circuit which generates the address of a word line in the normal area which is the subject of the CBR refresh operation based on CBR refresh commands for the normal area, and performs the CBR refresh operation of a memory cell which is connected to the word line in the normal area corresponding to the address generated by the normal word line address generating circuit, and
the redundancy area refresh circuit comprises a redundancy word line address generating circuit which generates the address of a word line in the redundancy area which is the subject of the CBR refresh operation, and performs the CBR refresh operation of a memory cell which is connected to the word line in the redundancy area corresponding to the address generated by the redundancy word line address generating circuit.

3. The semiconductor storage device according to claim 2, wherein the normal word line address generating circuit is a normal word refresh counter which counts the CBR refresh commands for the normal area and generates the address of the word line in the normal area which is the subject of the CBR refresh operation, and
the redundancy word line address generating circuit is a redundancy word refresh counter which generates the address of the word line in the redundancy area which is the subject of the CBR refresh operation based on the address generated by the normal word refresh counter.

4. The semiconductor storage device according to claim 2, wherein the redundancy word line address generating circuit generates the address of the word line in the redundancy area every time that the address of the word line in the normal area is generated a predetermined number of times, and
the redundancy area refresh circuit performs the CBR refresh operation of the memory cell in the redundancy area every time that the CBR refresh operation of the memory cell in the normal area is performed the predetermined number of times.

5. The semiconductor storage device according to claim 4, wherein when the number of word lines in the normal area is m and the number of word lines in the redundancy area is p, the predetermined number of times is an integer greater than or equal to 1 and less than or equal to m/p.

6. The semiconductor storage device according to claim 5, wherein the predetermined number of times is m/p.

7. The semiconductor storage device according to claim 2, further comprising a test mode signal generator which generates a test mode signal when a refresh test of the redundancy area is performed,
wherein the redundancy word line address generating circuit generates the address of the word line in the redundancy area if the test mode signal is generated.

8. The semiconductor storage device according to claim 2, wherein the redundancy word line address generating circuit detects that the value of lower bits of the address generated by the normal word line address generating circuit has a predetermined value, and generates the address of the word line in the redundancy area based on upper bits of the address generated by the normal word line address generating circuit in synchronization with a CBR refresh command.

9. The semiconductor storage device according to claim 8, wherein the predetermined value is all "0" or all "1".

10. The semiconductor storage device according to claim 2, comprising a plurality of plates each plate including the normal area and the redundancy area corresponding to the normal area,
wherein the redundancy word line address generating circuit generates the address of a word line in the redundancy area included in a plate which is different from a plate which includes the normal area which is the subject of the CBR refresh operation.

11. The semiconductor storage device according to claim 10, wherein the plurality of plates includes a first plate to an Nth plate, where N is an integer greater than or equal to 1,
the normal area in each plate includes m word lines and the redundancy area in each plate includes p word lines, where m and p are integers greater than or equal to 1,
the addresses of the m word lines in the normal area are respectively set to (i−1)m to im−1 for an ith plate, where i is an integer in the range between 1 and N, and
the addresses of the p word lines in the redundancy area are respectively set to (N−i)p to (N−i+1)p−1 for the ith plate.

12. The semiconductor storage device according to claim 1, wherein the redundancy area refresh circuit performs CBR refresh operations for all the word lines in the redundancy area on or before the completion of CBR refresh operations by the normal area refresh circuit for all the word lines in the normal area.

13. A semiconductor storage device comprising:
a storage means including a normal area and a redundancy area for replacing a defective memory cell in the normal area;
a normal area refresh means for generating an address of a word line in the normal area and performing a CBR refresh operation of a memory cell connected to the word line in the normal area; and
a redundancy area refresh means for receiving the address from the normal area refresh circuit and based on the address performing a CBR refresh operation of a memory cell connected to a word line in the redundancy area in parallel with the CBR refresh operation of the memory cell in the normal area.

14. The semiconductor storage device according to claim 1, wherein the redundancy area refresh circuit detects that a value of lower bits of the address generated by the normal area refresh circuit has a predetermined value.

15. The semiconductor storage device according to claim 14, wherein the redundancy area refresh circuit generates an address of the word line in the redundancy area based on upper bits of the address generated by the normal area refresh circuit in synchronization with a CBR refresh command.

16. The semiconductor storage device according to claim 1, wherein the redundancy area refresh circuit comprises:
a sense amplifier array which performs the CBR refresh operation of the redundancy area; and
a control circuit which receives the CBR refresh command and controls the sense amplifier array.

17. The semiconductor storage device according to claim 1, further comprising:
a command decoder which receives input signals from outside of the semiconductor storage device, and generates the CBR refresh command based on the input signals.

18. The semiconductor storage device according to claim 17, wherein the normal area refresh circuit comprises a normal word refresh counter which counts the CBR refresh commands for the normal area and generates the address of the word line in the normal area which is the subject of the CBR refresh operation, and
wherein the redundancy area refresh circuit comprises a redundancy word refresh counter which generates the address of the word line in the redundancy area which is the subject of the CBR refresh operation based on the address generated by the normal word refresh counter, and
wherein the redundancy word refresh counter is controlled by the command decoder and the normal word refresh counter.

19. The semiconductor storage device according to claim 18, wherein the redundancy area refresh circuit further comprises:
a redundancy X decoder which receives the address of the word line in the redundancy area from the redundancy word refresh counter, and selects the word line in the redundancy area.

20. A circuit for performing a column-address-strobe before row-address-strobe (CBR) refresh operation in a redundancy area of a memory cell array of a semiconductor storage device, the semiconductor storage device including which a normal area refresh circuit which generates an address of a word line in a normal area of the memory cell array and performs a CBR refresh operation of a memory cell which is connected to the word line in the normal area, the redundancy area refresh circuit comprising:
a redundancy area refresh circuit which receives the address from the normal area refresh circuit and based on the address performs a CBR refresh operation of a memory cell which is connected to a word line in the redundancy area in parallel with the CBR refresh operation of the memory cell in the normal area.

* * * * *